United States Patent
Shieh et al.

(10) Patent No.: US 6,323,705 B1
(45) Date of Patent: Nov. 27, 2001

(54) DOUBLE CYCLE LOCK APPROACH IN DELAY LOCK LOOP CIRCUIT

(75) Inventors: Je-Hurn Shieh, Cupertino; Steven Lai, Milpitas, both of CA (US)

(73) Assignee: Winbond Electronics Corporation, Hsin-Chu (TW)

(*) Notice: Subject to any disclaimer, the term of this patent is extended or adjusted under 35 U.S.C. 154(b) by 0 days.

(21) Appl. No.: 09/559,020

(22) Filed: Apr. 25, 2000

(51) Int. Cl.$^7$ .................................................. H03L 7/06
(52) U.S. Cl. .......................... 327/158; 327/161; 365/233
(58) Field of Search ................................. 327/149, 152, 327/153, 158, 161; 331/1 A, 17, 25; 375/376; 365/233

(56) References Cited

U.S. PATENT DOCUMENTS

| 6,049,239 | * | 4/2000 | Eto et al. ............................ 327/158 |
| 6,069,506 | * | 5/2000 | Miller, Jr. et al. ................... 327/156 |
| 6,069,507 | * | 5/2000 | Shen et al. ........................... 327/156 |
| 6,198,690 | * | 3/2001 | Kato et al. ............................ 365/233 |

OTHER PUBLICATIONS

Shim, D. et al., "An Analog Synchronous Mirror Delay for High-Speed DRAM Application", IEEE Jr. of Solid-State Circuits, vol. 34, No. 4, Apr. 1999.

Saeki, T, et al., "A Direct-Skew-Detect Synchronous Mirror Delay for Application-Specific Integrated Circuits", IEEE Jr. of Solid-State Circuits, vol. 34, No. 4, Mar. 1999.

Kim, C.H. et al., "A 64-Mbit, 640-MByte/s Bidirectional Data Strobed, Double-Data-Rate SDRAM with a 40-mW DDL for a 256-MByte Memory System", IEEE Jr. of Solid-State Circuits, vol. 33, No. 11, Nov. 1998.

Lin, F., et al., "A Register-Controlled Symmetrical DLL for Double-Data-Rate DRAM" IEEE Jr. of Solid-State Circuits, vol, 34, No. 4, Apr. 1999.

Saeki, T. et al., "A 2.5-ns Clock Access, 250-MHx, 256-Mb SDRAM with Synchronous Mirror Delay" IEEE Jr. of Solid-State Circuits, vol. 31, No. 11, Nov. 1996.

Hatakeyama, A., et al., "A 256-Mb SDRAM Using a Register-Controlled Digital DLL" IEEE Jr. of Solid-State Circuits, vol. 32, No. 11, Nov. 1997.

* cited by examiner

Primary Examiner—Terry D. Cunningham
Assistant Examiner—Quan Tra

(57) ABSTRACT

A double data rate (DDR) synchronous dynamic RAM (SDRAM) includes delay lock loop circuitry which is designed so as to significantly reduce the locking period associated with achieving the lock state of the delay lock loop. The delay lock loop circuit includes a first adjustable delay unit circuit for delaying the external clock so as to provide the DDR operation and includes a feedback loop having a shift register controlled by a phase detector which is used to set an optimum delay value. The delay value is then used to control the first delay unit circuit and determine the amount of delay time it provides. The delay lock loop further includes a second delay unit circuit which is initially enabled by the rising edge of the first clock cycle of an internal feedback clock signal and then is disabled by the rising edge of the second clock cycle of the external clock signal such that a digital value in close range to the optimum lock state delay value is established on the output of the second delay unit circuit by the second cycle of the external clock signal. This digital value is used to pre-set the shift register which, in turn, is used to control the first delay unit. As a result, the period of time required to achieve a lock state within the delay lock loop circuit and stand-by current consumption due to the DLL circuit are significantly reduced.

12 Claims, 6 Drawing Sheets

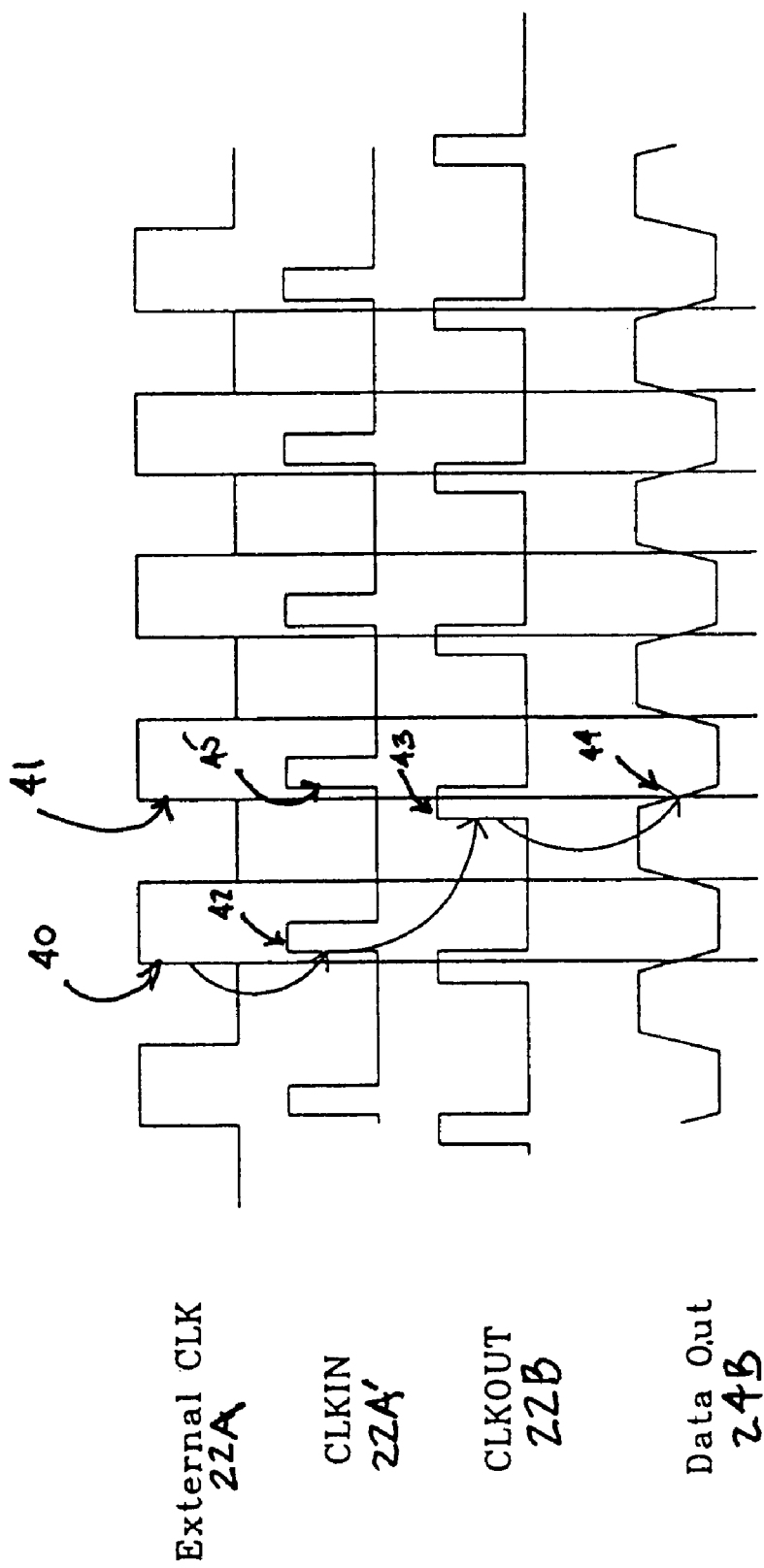

DOUBLE CYCLE LOCK APPROACH IN DELAY LOCK LOOP CIRCUIT

BACKGROUND OF THE INVENTION

1. Field of the Invention

The present invention relates to Synchronous Dynamic Random Access Memories (SDRAMs), and particularly to Delay Lock Loop (DLL) circuitry employed within SDRAMs for obtaining double data rate (DDR) memory access.

2. State of the Art

In conventional synchronous DRAMs, the timing of when output data is made available or is clocked through the output buffer of the memory device is dependent on when valid data is available from the memory cell array. Specifically, in these conventional systems, data output timing is determined by the access time (tAC) and the output hold time (tOH) of the SDRAM. In order to ensure valid data, the output data is synchronized to be clocked from the output buffer during the time interval between tAC and tOH. This is achieved by designing the memory device with a predetermined delayed clock signal for clocking data through the memory device output buffers.

In an alternative SDRAM design, data output is synchronized to the subsequent rising and/or falling edge of the system clock. An example of this type of SDRAM design is a double data rate (DDR) SDRAM. The DDR SDRAM includes delay lock loop (DLL) circuitry for controlling the internal clock of the memory device so as to synchronized data output with the rising/falling edges of the external system clock. The DLL circuitry inserts an optimum delay time between the clock input buffer and the data output buffer making the data switch simultaneously with the external clock.

FIG. 1A shows a system block diagram of a SDRAM 10 design including DLL circuitry 11 which in response to external clock signal 11A provides an optimum delayed clock signal 11B to the output buffer 12 such that the data 12A from the DRAM core 13 is output from the buffer 12 on the rising and falling edge of the external clock 11A to provide Output Data signal 12B.

FIG. 1B shows a basic prior art digital DLL circuit design 14 including an input receiver buffer 15 for receiving an external clock signal 15A and providing an internal clock signal 15B to a Delay Unit circuit 16. The Delay Unit circuit 16 is adjustably controlled with digital data stored within a shift register 17. Delay Unit circuit 16 delays the internal clock signal 15B by the amount programmed into the shift register. Clock signal 16A is used to clock output buffer 18 such that data 18A from the DRAM core is clocked through buffer 18 on the subsequent rising and falling edges of the external clock signal 15A. The DLL circuit further includes a feedback loop having a Phase Detector 19 which detects the phase difference between a feedback clock signal 16A' and the internal clock signal 15B and generates the signals for controlling the shift register to shift left or right thereby increasing or decreasing the delay, respectively. Dummy output buffer 20 and Dummy receiver buffer 21 provide a path for feedback Clk signal 16A that is equivalent to the path that the external clock signal 15A passes through to the output of the system. The delay value stored in register 17 is used to control delay unit circuit 16 causing it to provide a delay such that data 18A is clocked through buffer 18 to the output of the memory device on each of the next rising or falling edge of the external clock signal.

In order to obtain the desired delay value in register 17 the delay lock loop must be set in a lock state in which there is no phase difference between the clock signal 15B and the feedback clock signal 16A', i.e. signals 15B and 16A' have synchronized rising and falling clock edge timing. When signals 15B and 16A' have synchronized timing then signal 15A and signal 9 also have synchronized timing since the timing of signal 15A and signal 9 correspond to the timing of signal 15B and signal 16A', respectively, minus the delay time contributed from equivalent delay receivers 15 and 21. In addition, since the timing of signal 9 is:

$$\text{timing}_{Data\ Out} = \text{timing}_{15A} + \text{delay}_{output\ buffer\ 18}$$

$$\text{timing}_{Data\ Out} = \text{timing}_{15A} + \text{delay}_{dummy\ output\ buffer\ 20}$$

$$\text{timing}_{Data\ Out} = \text{timing}_9,$$

an since dummy buffer 20 provides an equivalent delay as output buffer 18, then the timing of signal 9 is synchronized with the timing of the Data Out Signal. Consequently, since signal 9 is synchronized with both of signals 15A and the Data Out Signal, then the External Clk Signal 15A is synchronized with the Data Out Signal when the DLL circuit is in a lock state thereby providing the desired function of synchronizing rising and falling clock edges of the external clock and the output data of the memory system.

The problem with current DLL circuit designs is that, upon start-up, they require a period of time for the feedback loop to obtain the lock state when there is no phase difference between the feedback signal 16A' and the internal clock signal 15B and the timing of the External Clock 15A is synchronized with the Data Out signal as described above. In this state, an optimum delay value is stored in the shift register 17. Obtaining a lock state can take as many as 100–200 clock cycles. In addition, these clock cycles significantly increase stand-by current consumption.

What would be desirable is to reduce the time it takes for the DLL circuit to obtain a lock state and to minimize stand-by current due to the DLL circuit in DRR SDRAM memory applications.

SUMMARY OF THE INVENTION

A delay lock loop (DLL) circuit and a synchronous memory system with a DLL circuit thereof having a reduced locking period for achieving a fast lock state within the DLL circuit.

In one embodiment, the delay lock loop circuit includes a first path having a first delay unit circuit for receiving an external clock signal and generating a delayed output clock signal corresponding to the external clock signal delayed by the amount of delay time provided by the first delay unit circuit. The first delay unit circuit is controlled by a digital value stored in a shift register such that the delay time provided by the first delay unit circuit can be adjusted by adjusting the digital value in the shift register. The delay lock loop circuit includes a feedback path with a phase detector for detecting the phase difference between the external clock signal and a feedback signal corresponding to the delayed output clock signal which has been fed back through the whole delay path. Dependent on the detected phase difference, the phase detector generates control signals for controlling the shift register so as to adjust the delay value stored in the register to obtain a desired delay time wherein no phase difference is detected.

The delay lock loop circuit further includes a second delay unit circuit which generates a digital value during start-up of the memory system which is used to pre-set the shift register circuit. The second delay unit circuit includes a plurality of individual delay unit elements. The individual elements in the second delay unit circuit are enabled in response to the rising edge of the first clock cycle of the feedback clock signal. Once enabled, a fixed voltage corresponding to a high logic state which is coupled to the first one of the plurality of individual delay units begins to sequentially propagate through the remainder of the individual delay units in the second delay unit circuit and their corresponding outputs. The second delay unit circuit is then disabled in response to a subsequent rising edge of second cycle of the external clock signal thereby stopping the propagation of the high logic state voltage through the second delay unit circuit. The digital value established on the output of the second delay unit circuit during this time interval pre-sets the shift register. The digital value pre-set into the shift register will reflect a digital value for controlling the first delay unit circuit which is in close range to the digital value to obtain the optimum lock state of the DLL circuit. As a result, the large delay associated with obtaining a lock state within the delay lock loop circuit is significantly reduced.

In one embodiment of the synchronous memory system having a delay lock loop circuit with reduced lock state delays, the system includes a synchronously accessed array of memory cells for providing data when accessed, an output buffer for receiving the data from the memory cells and in response to an internal delayed clock signal, outputting the data from the memory system, and a delay lock loop circuit for providing the delayed output clock signal such that data output from the memory system is synchronized with the rising and/or falling edges of the external clock. The delay lock loop circuit includes a first path including a first delay unit circuit for receiving an external clock signal and generating the delayed output clock signal corresponding to the external clock signal delayed by the amount of delay time provided by the first delay unit circuit. The first delay unit circuit is controlled by a digital value stored in a shift register such that the delay time provided by the delay unit circuit can be adjusted by adjusting the digital value in the shift register. The delay lock loop circuit includes a feedback path with a phase detector for detecting the phase difference between the external clock signal and a feedback clock signal corresponding to the delayed output clock signal which has been fed back through the whole feedback path. Dependent on the detected phase difference, the phase detector generates control signals for controlling the register so as to adjust the delay value stored in the register to obtain a desired delay value such that no phase difference is detected.

The delay lock loop circuit further includes a second delay unit circuit which generates a digital delay value during start-up of the memory system which pre-sets the shift register circuit. The second delay unit circuit includes a plurality of individual delay unit elements. The individual elements in the second delay unit circuit are enabled in response to the rising edge of the first cycle of the feedback clock signal. Once enabled, a fixed voltage corresponding to a high logic state which is coupled to the first one of the plurality of individual delay units begins to sequentially propagate through the remainder of the individual delay units in the second delay unit circuit and their corresponding outputs. The second delay unit circuit is then disabled in response to a subsequent rising edge of the second cycle of the external clock signal thereby stopping the propagation of the high logic state voltage through the second delay unit circuit. The digital value established on the output of the second delay unit circuit during this time interval pre-sets the shift register. The digital value pre-set into the shift register will reflect the delay value for controlling the first delay unit circuit which is in close range to the digital value to obtain the optimum lock state of the DLL circuit. As a result, the large delay associated with obtaining a lock state within the delay lock loop circuit is significantly reduced.

BRIEF DESCRIPTION OF THE DRAWINGS

The present invention may be further understood from the following written description in conjunction with the appended drawings. In the drawings:

FIG. 4 shows one timing diagram of the operation of the delay lock loop circuit shown in FIG. 2.

DETAILED DESCRIPTION OF THE PREFERRED EMBODIMENTS

In the foregoing description, numerous specific details are set forth, such as specific digital elements in order to provide a thorough understanding of the present invention. It will be apparent, however, to one skilled in the art that these specific details need not be employed to practice the present invention. In other instances, well known synchronous memory system theory have not been described in order to avoid unnecessarily obscuring the present invention.

Figure 1A:
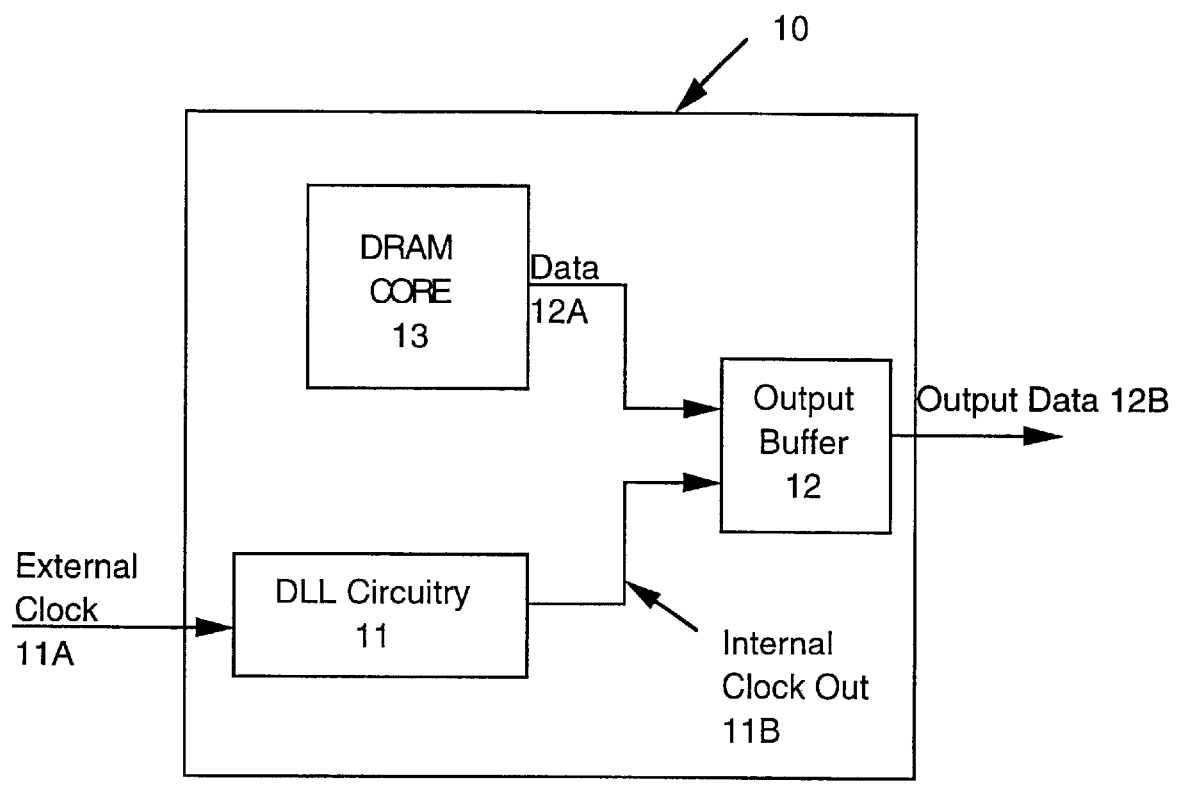
FIG. 1A shows a system block diagram of a SDRAM including DLL circuitry.
Figure 1B:
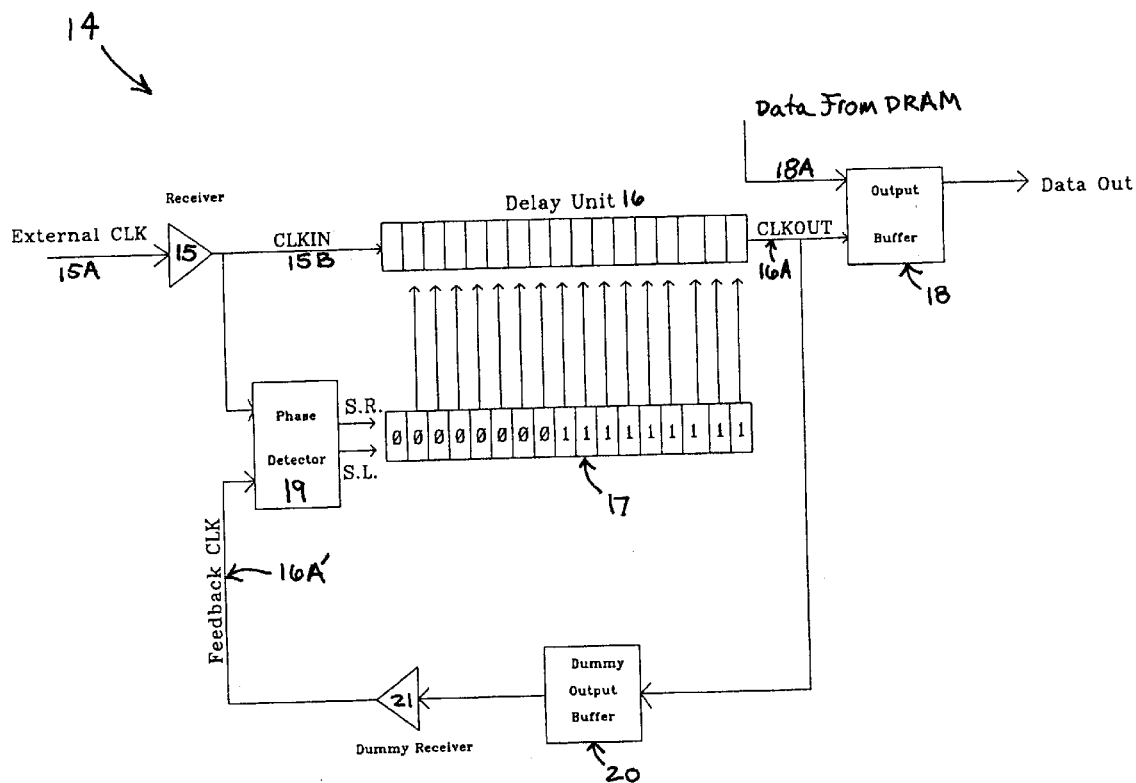
FIG. 1B shows a prior-art digital DLL circuit.
Figure 2:
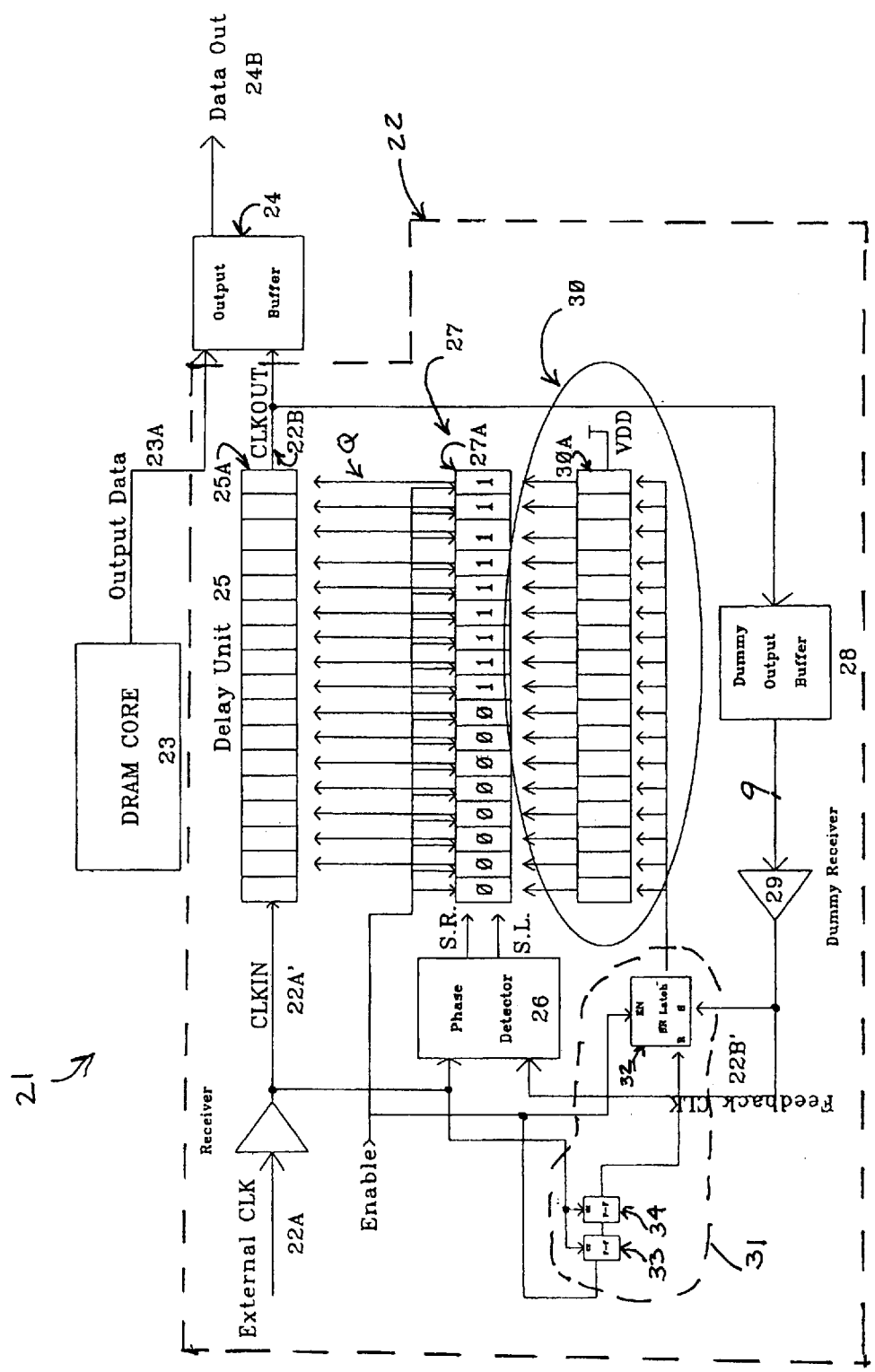
FIG. 2 shows one embodiment of a DLL circuit using an additional delay unit circuit to reduce lock loop delay within a synchronous memory system in accordance with the present invention.

FIG. 2 shows a synchronous memory system 21 with a delay lock loop circuit 22 having reduced lock loop delay in accordance with one embodiment of the present invention. In this embodiment, the memory system is a synchronous dynamic RAM (SDRAM). In another embodiment, the memory system is a double data rate (DDR) SDRAM. The memory system includes a array of synchronously accessed memory cells (Memory Core 23) which when accessed outputs a data signal 23A to an output buffer 24. Output buffer 24 is clocked by a clock signal 22B generated by delay lock loop circuit 22 and outputs a data output signal 24B to the memory system buffer output port.

The delay lock loop circuit 22 generates clock signal 22B by delaying the external system clock by a predetermined delay amount provided by a delay unit circuit 25. As shown in FIG. 2, the delay lock loop circuit includes a first circuit path for receiving the external system clock signal 22A. System clock signal 22A is coupled to an input receiving buffer which outputs an internal clock signal, CLKIN 22A'. A first delay unit circuit 25 delays the clock signal 22A' and outputs a delayed output clock signal 22B for clocking buffer 24.

Figure 3A:
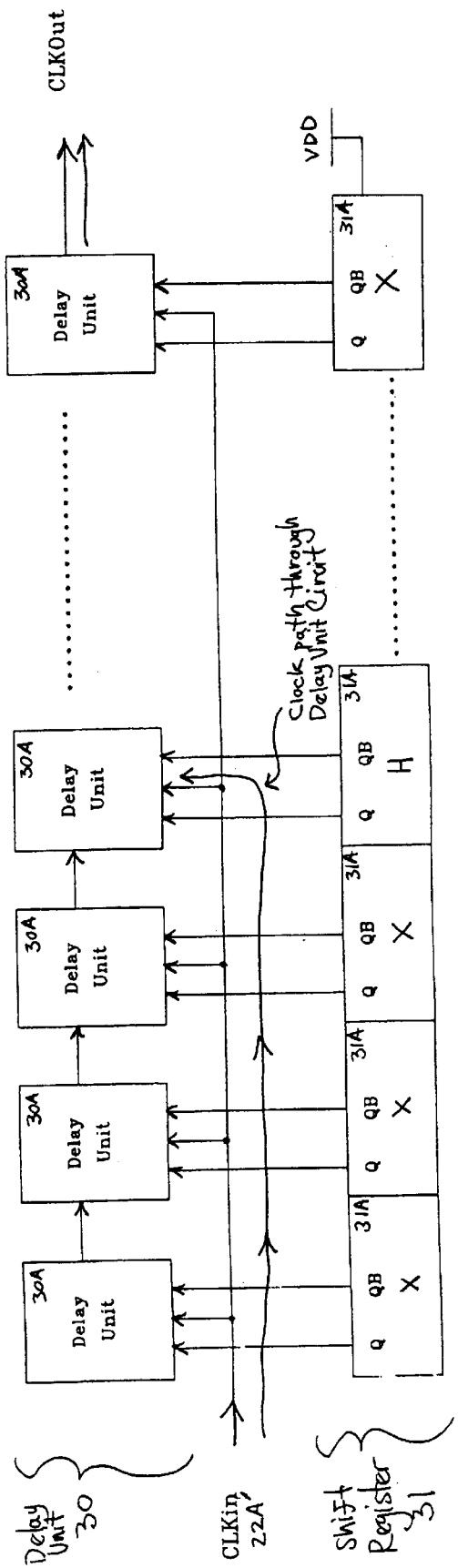
FIG. 3A shows one embodiment of a delay unit circuit and shift register configuration within the DLL circuit shown in FIG. 2.

In one embodiment, delay unit circuit 25 and the shift register configuration can be embodied as shown in FIG. 3A as described in "A Register-Controlled Symmetrical DLL for Double-Data Rate DRAM" by Feng Lin, et al., *IEEE Journal of Solid-State Circuits*, Vol. 34 No. 4 (April 1999) pp. 565–56.

FIG. 3A shows a delay unit circuit 30 including a plurality of individual delay units 30A. It should be understood that each delay unit can be implemented using logic gates such as inverters, NAND gates, or AND gates. Each delay unit 30A provides an increment of delay time when the delay unit is enabled and the clock signal propagates through it. The delay unit circuit 30 is coupled to the outputs Q and Q\ of each flip-flop 31A in the shift register 31. The logic state on the output of each flip-flop enables/disables its corresponding individual delay unit so as to determine the path that clock signal 22A' propagates through within delay unit circuit 30 and hence how much time clock signal 22A' is delayed by.

The delay lock loop circuit further includes a feedback loop having a phase detector 26 coupled to clock signal 22A' and feedback clock signal 22B'. Phase detector 26 generates control signals S.R. (shift right) and S.L. (shift left) in response to a detected phase difference between clock signals 22A' and 22B'. The control signals are coupled to a shift register 27 including a plurality of individual cells or flip-flops 27A. During real-time operation (i.e., not during start-up or stand-by), the shift register 27 responds to the control signals provided from phase detector 26 by shifting the value stored within shift register 27 left or right thereby reducing or increasing the delay value stored in the shift register 27 to maintain a "no phase difference" state (i.e., lock state) between signals 22A' and 22B'. Each flip-flop 27A has an output Q (or outputs Q and Q\) which is coupled to a corresponding individual delay unit 25A within delay unit circuit 25 and each individual unit 25A represents an increment in delay time that can be provided by delay unit circuit 25 depending on the control signal Q coupled from its corresponding flip-flop. For instance, the output Q of the individual flip-flop 27A determines whether the clock signal 22A' will propagate through the corresponding individual delay unit circuit 25A and hence whether the unit 25A adds to the total delay of the clock signal 22B. Dummy Output Buffer 28 and Dummy Receiver 29 provide a path for feedback Clk signal 22B' that is the equivalent of the signal path traveled by external clock signal 22A from the input of the device receiver to the buffer output port.

Figure 3B:
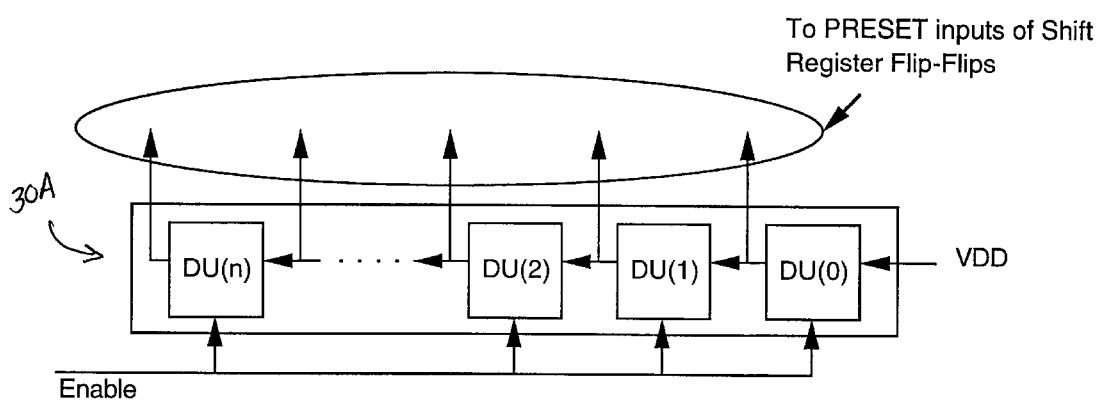
FIG. 3B shows one embodiment of the additional delay unit circuit within the DLL circuit shown in FIG. 2.

The delay lock loop circuit 22 further includes a second delay unit circuit 30 including a plurality of individual delay units. FIG. 3B shows one embodiment of the additional delay unit 30 circuit. Delay unit circuit 30 includes a plurality of individual delay units DU(0)–DU(n), the same number as the individual delay units in delay unit circuit 25. Each delay unit is essentially the same and provides the same incremental delay amount. As described above, delay units can be implemented using logic gates such as NAND gates, AND gates, inverters. The first unit, DU(0) has its input coupled to a fixed logic high "1" signal. The output of each individual delay unit is coupled to 1) the input of the next sequential individual delay unit; and 2) the preset input of its corresponding flip-flop in shift register 27. For instance, referring to FIG. 2, the output of delay unit 30A is coupled to the preset input of flip-flop 27A. In addition, each of delay units DU(0)–DU(n) have an enable input for applying an enable signal to such that when a delay unit is enabled, it passes the data from its input to its output such that the output data is delayed in time with respect to the input data by the incremental delay amount.

Delay lock loop circuit 22 further includes controller 31 for enabling the second delay unit circuit 30 in response to the rising edge of the first clock cycle of feedback clock signal 22B' and for disabling the second delay unit circuit 30 in response to the rising edge of the second clock cycle of the external clock signal. In this embodiment, controller 31 includes a SR latch 32, a first flip-flop 33, and a second flip-flop 34. The latch has its set input port (S) coupled to the feedback clock signal 22B', its enable input port (EN) coupled to the delay lock loop circuit enable signal (Enable), and its reset input port (R) coupled to the output of flip-flop 34. The input of flip-flop 33 is coupled to the delay lock loop enable signal (Enable) and each of flip-flops 33 and 34 have their clock inputs coupled to clock signal 22A'.

Referring to FIG. 2, the delay unit circuit 30 is employed during start-up of the memory system such that it generates a digital value which is used to preset the shift register 27. Specifically, between the first and second rising edges of the external clock signal after initiating start-up, delay unit circuit 30 generates a digital value which is in close range to the optimum lock state delay value. This delay value pre-sets the shift register 27 after the second clock cycle.

When the system is in its idle state, all of the flip-flops in the shift register 27 are re-set to "0" except for flip-flop 27A. As a result, only one individual delay unit 25A is enabled in the first delay unit 25 such that clock signal 22A' will initially propagate only through delay unit 25A. Initially upon system start-up, SR latch 32 and shift register 27 are enabled by the delay lock loop circuit Enable signal being set to a logic "1" state. In the meantime, the Enable signal is clocked from the input of flip-flop 33 to the input of flip-flop 34. Since the SR latch circuit is enabled, the clock signal 22A' propagates through delay unit circuit 25 (i.e., only through unit 25A), dummy buffer 28, and dummy receiver 29 and becomes feedback clock signal 22B'. The set input of SR latch 32 is coupled to the feedback clock signal 22B' such that when the first edge of the feedback clock signal 22B' transitions high it drives the output of latch 32 high and enables all of the individual delay units in the delay unit circuit 30. As a result, the logic high ("1") voltage (e.g., VDD) coupled to the first delay unit 30A begins to sequentially propagate through the individual delay units in delay unit circuit 30. As the voltage propagates through the individual delay units their outputs also transition high. In addition, since the output of each individual delay unit is coupled to the pre-set input of each flip-flop in shift register 27, each delay unit that the VDD voltage propagates through pre-sets its corresponding flip-flop in the shift register with a logic high state.

On the second rising edge of clock signal 22A', flip-flop 34 passes the "1" on its input to its output which is coupled to the reset input (R) of the SR latch 32. As a result, on the second rising edge of clock signal 22A', SR latch is reset to "0" thereby disabling the second delay unit circuit 30.

The digital value provided by delay unit 30 upon being disabled reflects the propagation of the first rising edge through unit 30. This value, which presets the shift register 27, corresponds to a delay time value which is in close range to the optimum lock state value for controlling the first delay unit circuit 25, i.e., the difference between the external clock signal 22A and the clock signal 22B.

It should be noted that second delay unit 30 is identical to first delay unit 25 such that each of individual delay units 30A are identical to individual delay units 25A.

It should also be understood that although controller 31 is shown implemented with SR latch 32, and flip-flops 33 and 34, it is possible to implemented it in a number of different manners to perform the desired function of enabling delay unit circuit 30 in response to the rising edge of the first cycle of the feedback clock signal and disabling delay unit circuit 30 in response to the rising edge of the second cycle of the external clock signal.

FIG. 4 shows a timing diagram of the operation of the delay lock loop circuit shown in FIG. 2. As shown, on the first rising edge 40 of the external clock signal 22A a clock pulse 42 propagates through delay unit circuit 25 and is output by delay unit 25 as clock signal 22B (pulse 43) which enables the second delay unit circuit 30 after passing through the dummy receiver and buffer. By the second rising clock edge 41 of external clock 22A a digital value is established on the output of the second delay unit circuit 30 which presets shift register 27 such that the rising edge 44 of Data Out signal 24B is closely synchronized with the second rising edge 41 of the external clock 22A. Occurring shortly after the second rising edge 41, the rising edge 45 of CLKIN signal 22A' causes second delay unit circuit 30 to be disabled.

Hence, a DLL circuit design is described which has significantly reduced locking period for achieving DLL circuit lock state. In addition, due to the reduction of the number of clock cycles required to achieve lock state, stand-by current is also significantly reduced. Specifically, during the first two clock cycles, the additional delay unit circuit is enabled and used to determine an optimum delay value for pre-setting the shift register used to control the first delay circuit. Once the first delay circuit is programmed with the pre-set delay value (i.e., after the first two cycles) the additional delay unit circuit is disabled. Since the DLL has been preset with a delay value close in range to the optimum lock state delay value, only a few fine-tune cycles are required to put the DLL circuit into lock state. Once the lock state is achieved, the DLL circuit is put in a stand-by low-current state.

Although the components of the present invention have been described in conjunction with certain embodiments, it is appreciated that the invention can be implemented in a variety of other ways. Consequently, it is to be understood that the particular embodiments shown and described by way of illustration is in no way intended to be considered limiting. Reference to the details of these embodiments is not intended to limit the scope of the claims which themselves recite only those features regarded as essential to the invention.

What is claimed is:

1. A delay lock loop circuit for a synchronous memory system comprising:
   a first path including a first adjustable delay unit circuit for receiving an external clock signal and generating an output clock signal which corresponds to the external clock signal delayed by a delay time provided by a first delay unit circuit;
   a feedback path including a phase detector and a register, the phase detector for detecting the phase difference between the external clock signal and a feedback clock signal corresponding to the generated output clock signal, the register for storing a delay value for controlling the first delay unit circuit and determining the delay time, the phase detector generating control signals dependent on the detected phase difference, the control signals for controlling the register to adjust the delay value stored in the register to obtain a desired delay value wherein no phase difference is detected;
   a controller for providing a control signal having a first enable state and a second disable state;
   a second delay unit circuit including a plurality of individual delay elements each having its enable/disable port coupled to the control signal, a first delay element of the plurality of elements having its input coupled to a fixed voltage corresponding to a first logic state;
   wherein, upon system start-up and when the control signal is switched from its disable state to its enable state in response to the rising edge of the first cycle of the feedback clock signal, the individual delay elements are enabled causing the fixed voltage to begin to propagate through the plurality of the individual delay elements; and
   when the control signal is switched to its disable state in response to the rising edge of the second cycle of the external clock signal occurring subsequent to the rising edge of the first cycle of the feedback clock signal the plurality of individual delay elements are disabled causing the desired delay value to be established on the output of the second delay unit circuit;
   wherein, the second delay unit circuit is used to pre-set the register with the desired delay value.

2. The circuit as described in claim 1 wherein the register is a shift register.

3. The circuit as described in claim 1 wherein the first and second delay units have identical designs.

4. The circuit as described in claim 1 wherein the memory system is a synchronous dynamic RAM (SDRAM).

5. The circuit as described in claim 4 wherein the SDRAM is designed to provide double data rate (DDR) operation.

6. The circuit as described in claim 1 wherein the controller comprises a SR latch, a first flip-flop, and a second flip-flop, the latch has its set input port (S) coupled to the feedback clock signal, its enable input port (EN) coupled to an enable signal, and its reset input port (R) coupled to the output of the second flip-flop, the input of the first flip-flop is coupled to the enable signal and each of the first and second flip-flops have their clock inputs coupled to the external clock signal, the enable signal being applied upon start up of the system, wherein the first and second flip-flops function to reset the SR latch on the rising edge of the second cycle of the external clock signal.

7. A synchronous memory system comprising:
   an array of memory cells for providing data when synchronously accessed;
   an output buffer for receiving the data from the memory cells and in response to a delayed output clock signal outputting the data from the memory system;
   a delay lock loop circuit for generating the delayed output clock signal in response to an external clock signal such that the memory system synchronously outputs the data from the buffer upon at least one of the rising and falling edges of the external clock, the delay lock loop circuit comprising:
      a first path including a first adjustable delay unit circuit for receiving an external clock signal and generating the delayed output clock signal which is the external clock signal delayed by an amount of delay time provided by the first delay unit circuit;
      a feedback path including a phase detector and a register, the phase detector for detecting the phase difference between the external clock signal and a feedback clock signal corresponding to the delayed output clock signal, the register for storing a delay value for controlling the first delay unit circuit and determining delay time, the phase detector generating control signals for controlling the register dependent on the detected phase difference, so as to adjust the delay value stored in the register to obtain a desired delay value wherein no phase difference is detected;
      a controller for providing a control signal having a first enable state and a second disable state;
      a second delay unit circuit including a plurality of individual delay elements each having its enable/ disable port coupled to the control signal, a first delay element of the plurality of elements having its input coupled to a fixed voltage corresponding to a first logic state;

wherein, upon system start-up when the control signal is switched from its disable state to its enable state in response to the rising edge of the first cycle of the feedback clock signal, the individual delay elements are enabled causing the fixed voltage to begin to propagate through the plurality of the second delay unit elements; and when the control signal is switched to its disable state in response to the rising edge of the second cycle of the external clock signal occurring subsequent to the first rising edge the plurality of delay elements are disabled causing the desired delay value established on the output of the second delay unit circuit;

wherein, the second delay unit circuit is used to pre-set the register with the desired delay value.

8. The system as described in claim 7 wherein the register is a shift register.

9. The system as described in claim 7 wherein the first and second delay units have identical designs.

10. The system as described in claim 7 wherein the memory system is a synchronous dynamic RAM (SDRAM).

11. The circuit as described in claim 10 wherein the SDRAM is designed to provide double data rate (DDR) operation.

12. The circuit as described in claim 7 wherein the controller comprises an SR latch, a first flip-flop, and a second flip-flop, the latch has its set input port (S) coupled to the feedback clock signal, its enable input port (EN) coupled to an enable signal, and its reset input port (R) coupled to the output of the second flip-flop, the input of the first flip-flop is coupled to the enable signal and each of the first and second flip-flops have their clock inputs coupled to the external clock signal, the enable signal being applied upon start up of the system, wherein the first and second flip-flops function to reset the SR latch on the rising edge of the second cycle of the external clock signal.

* * * * *